United States Patent
Ziazadeh et al.

(10) Patent No.: US 6,724,251 B1
(45) Date of Patent: Apr. 20, 2004

(54) APPARATUS AND METHOD FOR EMPLOYING GAIN DEPENDENT BIASING TO REDUCE OFFSET AND NOISE IN A CURRENT CONVEYOR TYPE AMPLIFIER

(75) Inventors: Ramsin M. Ziazadeh, San Jose, CA (US); Jitendra Mohan, Santa Clara, CA (US); Abu-Hena Mostafa Kamal, Santa Clara, CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 10/244,150

(22) Filed: Sep. 12, 2002

(51) Int. Cl.$^7$ ................................................. H03F 1/36
(52) U.S. Cl. ......................................... 330/86; 330/282
(58) Field of Search .......................... 330/86, 144, 254, 330/278, 282

(56) References Cited

U.S. PATENT DOCUMENTS 5,694,366 A * 12/1997 Chevallier et al. ............ 330/86
6,388,528 B1 * 5/2002 Buer et al. .................. 330/295

* cited by examiner

*Primary Examiner*—Khanh Van Nguyen
(74) *Attorney, Agent, or Firm*—Darby & Darby P.C.; John W. Branch

(57) ABSTRACT

A circuit with low noise and reduced offset that feeds an input of an opamp with a programmable feedback resistor that provides variable gain settings. Input biasing currents are varied using control bits that are also used to adjust the gain. When the input signal is small (gain at higher setting), a minimum bias current is provided to source the input voltage swing. This scheme reduces the noise and offset generated by the lower transconductance of a biasing transistor while maintaining a constant SNR and fixed offset even in the presence of relatively small input swings. Also, when the input signal is large (gain at lower setting), a maximum bias current can be provided to accommodate the relatively large input swing level. Although the overall noise and offset current are increased for large input swings, the overall SNR and offset is maintained for relatively lower input swings.

16 Claims, 5 Drawing Sheets

US 6,724,251 B1

APPARATUS AND METHOD FOR EMPLOYING GAIN DEPENDENT BIASING TO REDUCE OFFSET AND NOISE IN A CURRENT CONVEYOR TYPE AMPLIFIER

FIELD OF THE INVENTION

The present invention is directed to a variable gain voltage amplifier, and more particularly, to a current conveyor type voltage amplifier circuit that employs a gain dependent biasing scheme to reduce offset and noise to maintain the signal integrity when amplifying a varying input signal.

BACKGROUND OF THE INVENTION

In the past, different types of circuits have been employed to improve the performance of variable gain amplifiers that employ automatic gain control (AGC) circuits. AGC amplifiers are widely used in communication channels to automatically adjust gain in response to a varying peak to peak swing of an input signal. A typical AGC circuit detects an outputted signal's peak-to-peak swing, and then adjusts the gain by varying the feedback impedance network which is connected across an opamp to maintain a relatively constant level for the swing of the outputted signal. For example, when an inputted signal swings (rises) to a relatively high level, the AGC circuit will adjust the feedback impedance of the amplifier so that its gain is reduced. Similarly, when the inputted signal's swing is at a relatively low level, the AGC circuit adjusts the feedback impedance to provide more amplifier gain.

However, an unfortunate side effect of increasing amplifier gain in current conveyor type voltage amplifiers for a faint/weak input signal with a relatively small swing is an increase in noise and the offset voltage due to an increase in the feedback impedance that multiplies noise and offset contributions from the current conveyor's biasing (current sources) circuits. Thus, for relatively faint/weak signals, the operation of an AGC amplifier can degrade the signal to noise ratio (SNR). Accordingly, it would be advantageous to provide a variable gain amplification circuit that retains the benefits of an AGC circuit without degrading the SNR for weak/faint input signals with a relatively small swing.

SUMMARY OF THE INVENTION

The present invention is directed to an apparatus for amplifying a signal. A variable feedback resistance is coupled between the input and output terminals of an opamp. The input terminal of the opamp is connected to the output of the current conveyor circuit (the high impedance node). The input signal is converted into input current by a fixed resistor which connects to the input of the current conveyor circuit (low impedance node). The signal current then is conveyed (directed) to the input of the opamp and, through the feedback resistor to produce output voltage. Due to the high output impedance of the current conveyor circuit, the feedback factor of the amplifier remains close to unity and thus, operating at a loop gain which is close to the open-loop performance. This also results in reduction of power consumption by the opamp since the feedback factor remains close to unity across the AGC range. The current conveyor circuit consists of sink and source currents that are provided partly to bias the input signal swing current. In particular, the source current is scaled such that for a given input swing current, sufficient biasing current is available to maintain signal integrity. The sink current is scaled according to the source current to maintain the biasing conditions. The (sink and source) current sources produce noise and offset contributions that are proportional to the Gm (transconductance) of the transistors. To minimize the offset and noise for a given drain-to-source voltage the transistors are biased such that minimum Gm is achieved while the transistors remain in saturation region. The sink and source current sources are then scaled by the gain control setting of the amplifier to provide sufficient current for the required input current swing. In other words, when the input swing current is at minimum (maximum feedback resistance), the current sources provide minimum bias currents such that maximum SNR is achieved. On the other hand, when the input swing current is at maximum (minimum feedback resistance), the current sources provide large bias currents such that the overall signal-to-noise ratio is relatively constant. Thus, the SNR remains constant across the range of the ADC.

For one embodiment, the invention is directed to at least one switch for disabling at least a portion of the source current source if the high swing of the signal is small. The operation of the switch causes noise produced by at least a portion of the source current source to be reduced. Also, at least another switch is directed to disabling at least a portion of the sink current source if the low swing of the signal is small. The operation of this switch causes noise produced by at least a portion of the sink current source to be reduced.

For yet another embodiment, the invention is directed to at least one of a plurality of PMOS transistors that is employed by the source current source to provide the selected amount of current. Also, at least one of a plurality of NMOS transistors is employed by the sink current source to provide the selected amount of current.

For yet still another embodiment of the invention, the controller includes an automatic gain control component. Also, the controller can be used to determine the size of a peak-to-peak swing in the signal.

DETAILED DESCRIPTION OF THE PREFERRED EMBODIMENT

Figure 1:
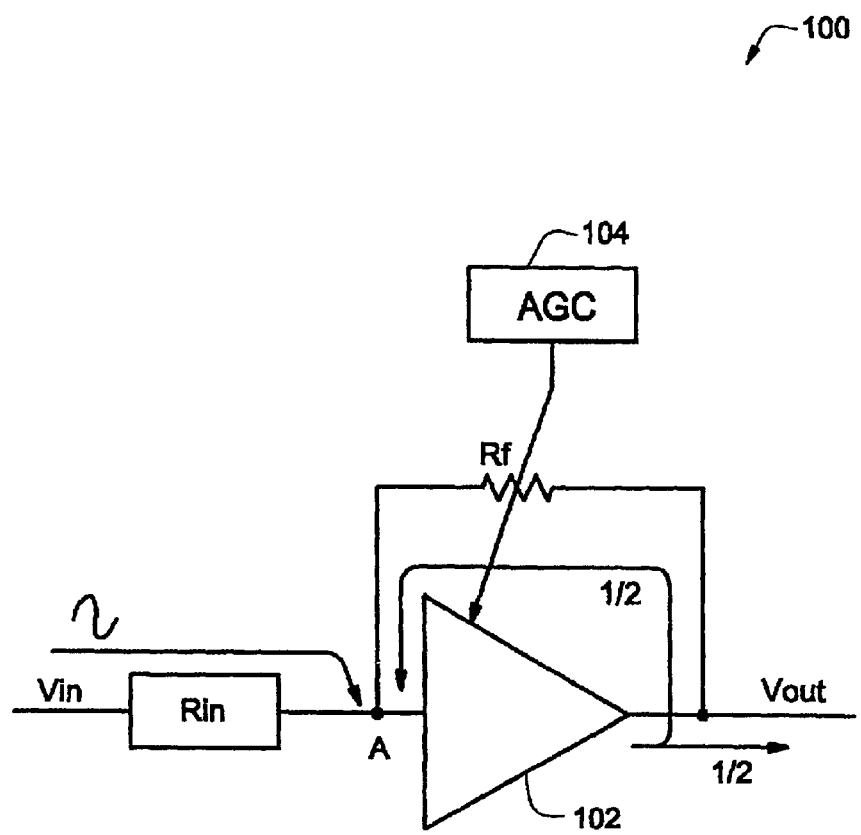
FIG. 1 illustrates a signal amplification circuit with automatic gain control.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

The present invention can be employed with any amplification circuit where it is desirous to provide reduced power consumption when amplifying a signal of varying strength with some form of variable gain, such as provided by an AGC circuit. The invention enables an amplifier to operate with loop gain configuration close to open loop performance. Also, the invention enables relatively stable noise and offset contributions for an amplification circuit even when the size of the peak-to-peak swing for an input signal varies. Typical applications might include wireless transceivers for mobile nodes such as mobile telephones, pagers, walkie-talkies, and the like. Similarly, wired transceivers employed with network interface cards might include applications that use the present invention.

FIG. 1 illustrates a signal amplification circuit 100 with automatic gain control (AGC). Amplifier 102 is shown configured for closed loop operation and provides variable gain by way of adjustments to the impedance of feedback resistor Rf, which is coupled between the input and output terminals of amplifier 102. An end of AGC component 104 is coupled to feedback resistor Rf to enable the AGC to vary the gain of circuit 100 in response to the size of the peak-to-peak swing of the signal outputted at terminal Vout.

The feedback factor (voltage at the input of the opamp) at Node A is represented by the equation Rin/(Rin+Rf). For a given Rf setting, the feedback factor of the amplifier varies across the AGC gain range or in other words, the loop gain and loop gain-bandwidth varies across the range of AGC. For example, assuming a unity gain configuration (Rin=Rf), the feedback factor equals ½ which, corresponds to a loop gain of 6 dB or less than the open-loop gain. This reduction in loop gain also reduces the gain-bandwidth frequency by ½. Thus, to operate the opamp at a desired loop gain and frequency, the open-loop gain and bandwidth of the amplifier must be twice as large as the desired gain and bandwidth.

Figure 2:
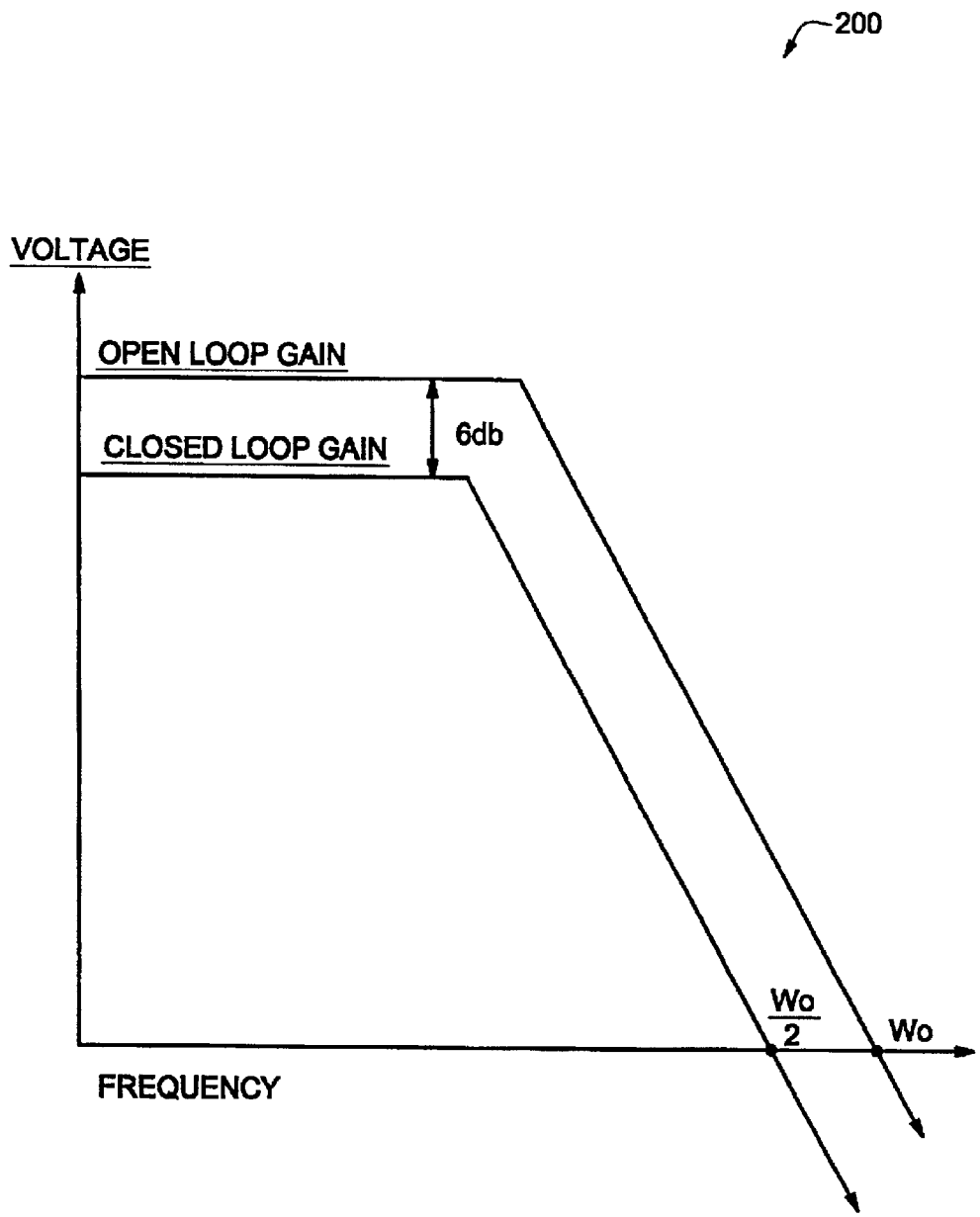
FIG. 2 shows a graph for the open loop and closed loop performance of the circuit illustrated in FIG. 1.

FIG. 2 shows graph 200, which illustrates a gain versus frequency relationship for a signal outputted by an amplification circuit such as the circuit shown in FIG. 1. As shown in FIG. 2, assuming Rin equals Rf, the amplification circuit operates at frequencies that are half as large under an open loop configuration and provide 50% (6 decibels) less gain than the frequencies and gain enabled in a closed loop configuration for this circuit.

Figure 3:
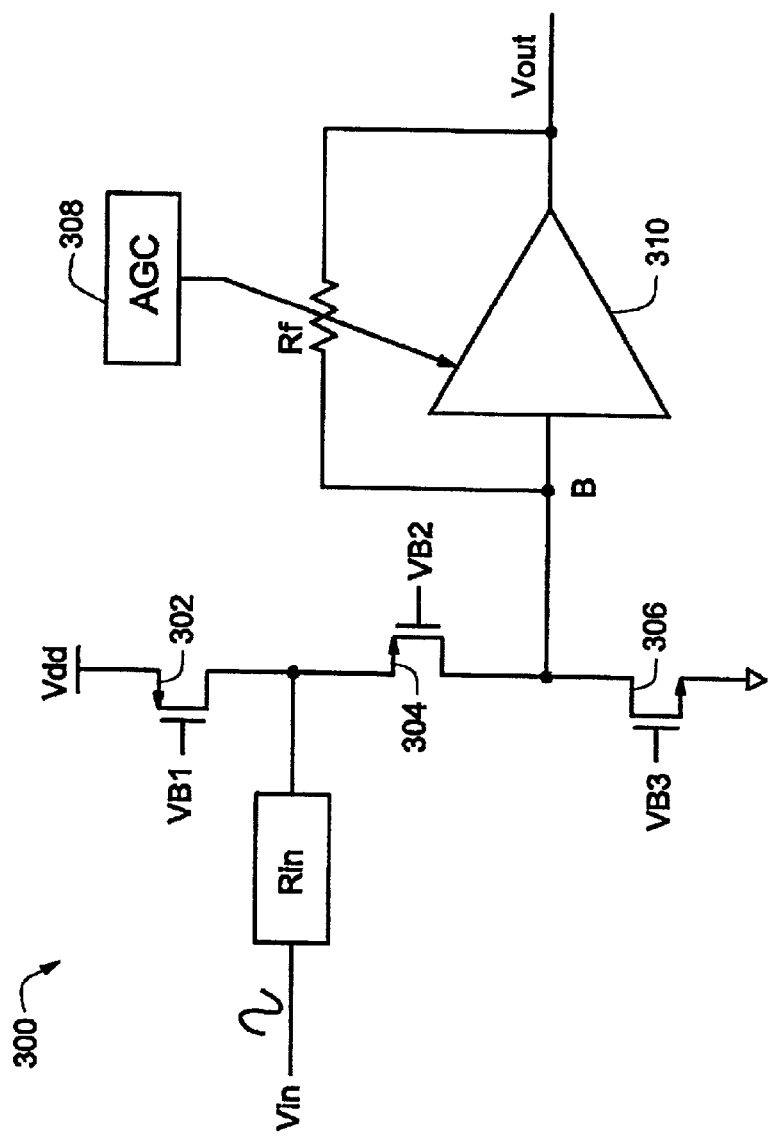
FIG. 3 shows another signal amplification circuit with automatic gain control that is further configured to have a loop gain substantially similar to open loop performance of the amplifier.

FIG. 3 illustrates signal amplification circuit 300 with AGC that is further configured to have an open loop gain similar to the open loop performance of the amplifier.

The configuration of circuit 300 is as follows. An input terminal Vin is coupled to an end of an input impedance Rin where a signal is inputted to the circuit. The other end of input impedance Rin is coupled to a drain terminal of PMOS transistor 302 and a source terminal of PMOS transistor 304. A source terminal of PMOS transistor 302 is coupled to a positive voltage supply Vdd. Also, a drain terminal of PMOS transistor 304, a drain terminal of NMOS transistor 306, the input to amplifier 310 and an end of feedback resistor Rf are coupled together at Node B. A source terminal of NMOS transistor 306 is coupled to a grounded terminal. The other end of feedback resistor Rf is coupled to the output of amplifier 310 and the output terminal Vout where the outputted signal is provided for use with other circuits. Additionally, although not shown, in some embodiments, the source terminal of NMOS transistor 306 may be coupled to a negative voltage supply.

In FIG. 3, AGC circuit 308 is coupled to feedback resistor Rf AGC circuit 308 can vary the feedback resistor's impedance (amplification circuit 300 gain) in proportion to the swing/strength of the signal received at input terminal Vin. In this way, the signal outputted at the output terminal Vout remains relatively constant as the strength of the signal varies.

AGC component 308 controls the operation of PMOS transistor 302 and NMOS transistor 306 so that relatively large currents are conveyed with the inputted signal to the input of amplifier 310 when the signal swings towards a positive or negative peak, respectively. For example, when the inputted signal is positive, PMOS transistor 302 conducts a current from the positive voltage supply to the input of amplifier 310 (Node B). A biasing voltage VB1 for PMOS transistor 302 is controlled by AGC component 308 in response to the swings of the inputted signal. Similarly, when the inputted signal swings low, NMOS transistor 306 is turned on by AGC component 308 with biasing voltage VB2 so that a current will flow to the input of amplifier 310.

Biasing PMOS transistor 302 provides the source current in the current conveyor circuit, which provides the required current when the input swing level is negative relative to the voltage at the biasing transistor's drain. Since the input impedance of the current conveyor (drain of biasing transistor 302) is proportional to the 1/Gm of PMOS transistor 304, the swing at the source of PMOS transistor 304 (or drain of biasing PMOS transistor 302) is relatively small compared to the input swing (virtual ground). The biasing NMOS transistor 306 provides the sink current source of the current conveyor circuit, which sinks the current associated with PMOS transistor 302 to maintain proper biasing conditions at Node B.

It is understood that the biasing PMOS transistor 302 and biasing NMOS transistor 306 are fixed transistors, which are scaled to provide the required biasing current when the input swing current (Vin/Rin) is at a maximum. In other words, the PMOS and NMOS biasing transistors are scaled for worst-case input current levels. The output of the current conveyor circuit at Node B, is a high impedance node given by the cascading of transistors 302 and 304 in parallel with biasing transistor 306. The feedback factor associated with this circuit topology is Ro/(Rf+Ro) where Ro is the output impedance of the current conveyor. The feedback factor can be designed where Ro>>Rf such the feedback factor is close to unity across the range of Rf. In this way, a loop-gain and loop-gain-bandwidth can be maintained close to open-loop performance.

Also, in FIG. 3, it is understood that the amount of current that is supplied by the current conveyor sources is fixed, e.g., 100 microamps might be supplied by the conduction of either PMOS transistor 302 or NMOS transistor 306. This fixed amount of current is typically selected to enable optimal operation of the circuit when the signal inputted at terminal Vin is relatively large. However, when the received signal is relatively small/weak, this same amount of current can lead to a degradation in the signal to noise ratio (SNR) for the circuit. In particular, the SNR for inputted signals with relatively small peak to peak swings may be adversely affected by the amount of noise in the relatively large currents provided by the current conveyor sources, i.e., PMOS transistor 302 and NMOS transistor 306. In some cases, the currents supplied for a large signal swing may be less than optimum for an inputted signal with a relatively small signal swing. Additionally, since so much more of the actual signal outputted by amplifier 310 can be made available for use with other circuits at terminal Vout, circuit 300 can consume substantially less power than other amplification circuits operating in the closed loop mode, such as shown in FIG. 1.

Figure 4:
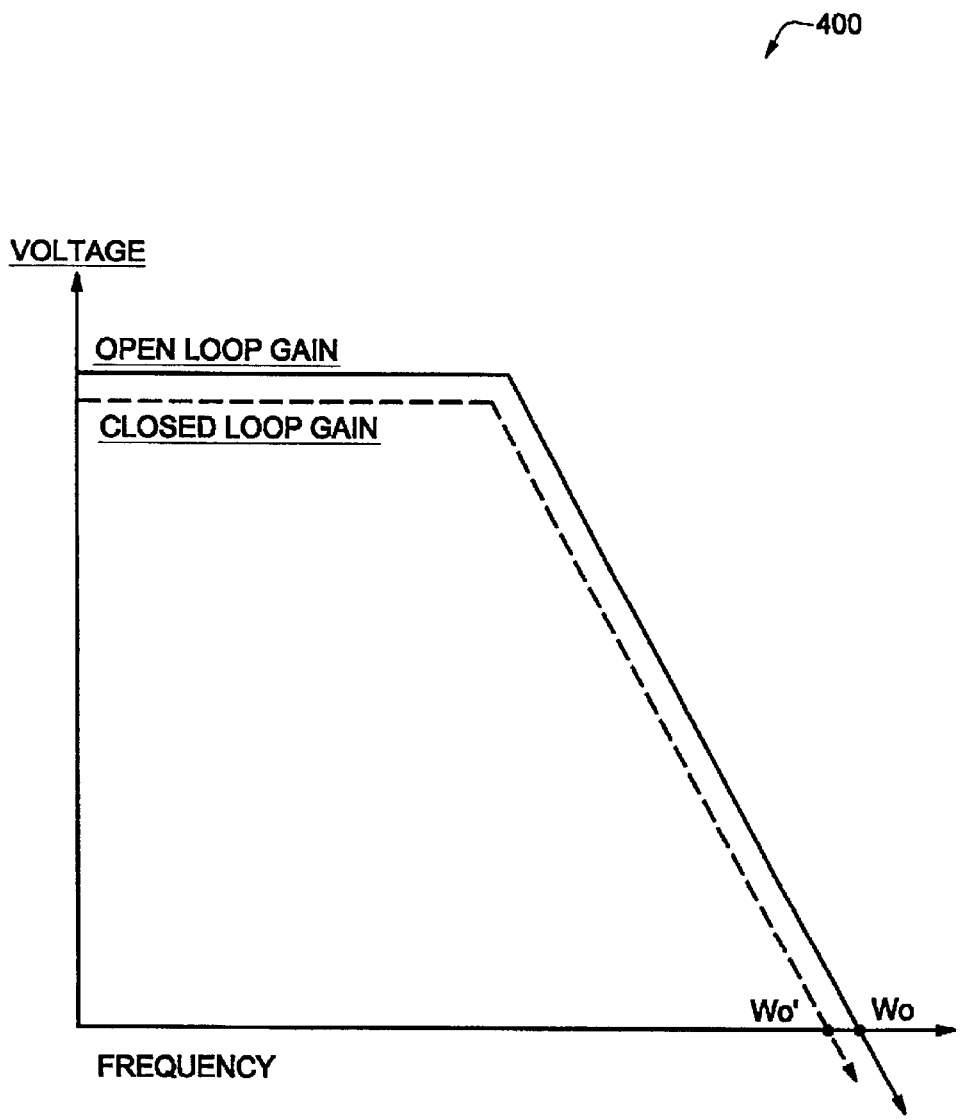
FIG. 4 illustrates a graph for the open loop gain and the loop gain performance of the circuit shown in FIG. 3.

FIG. 4 illustrates graph 400 for the open loop gain and the loop gain performance of the circuit shown in FIG. 3.

Figure 5:
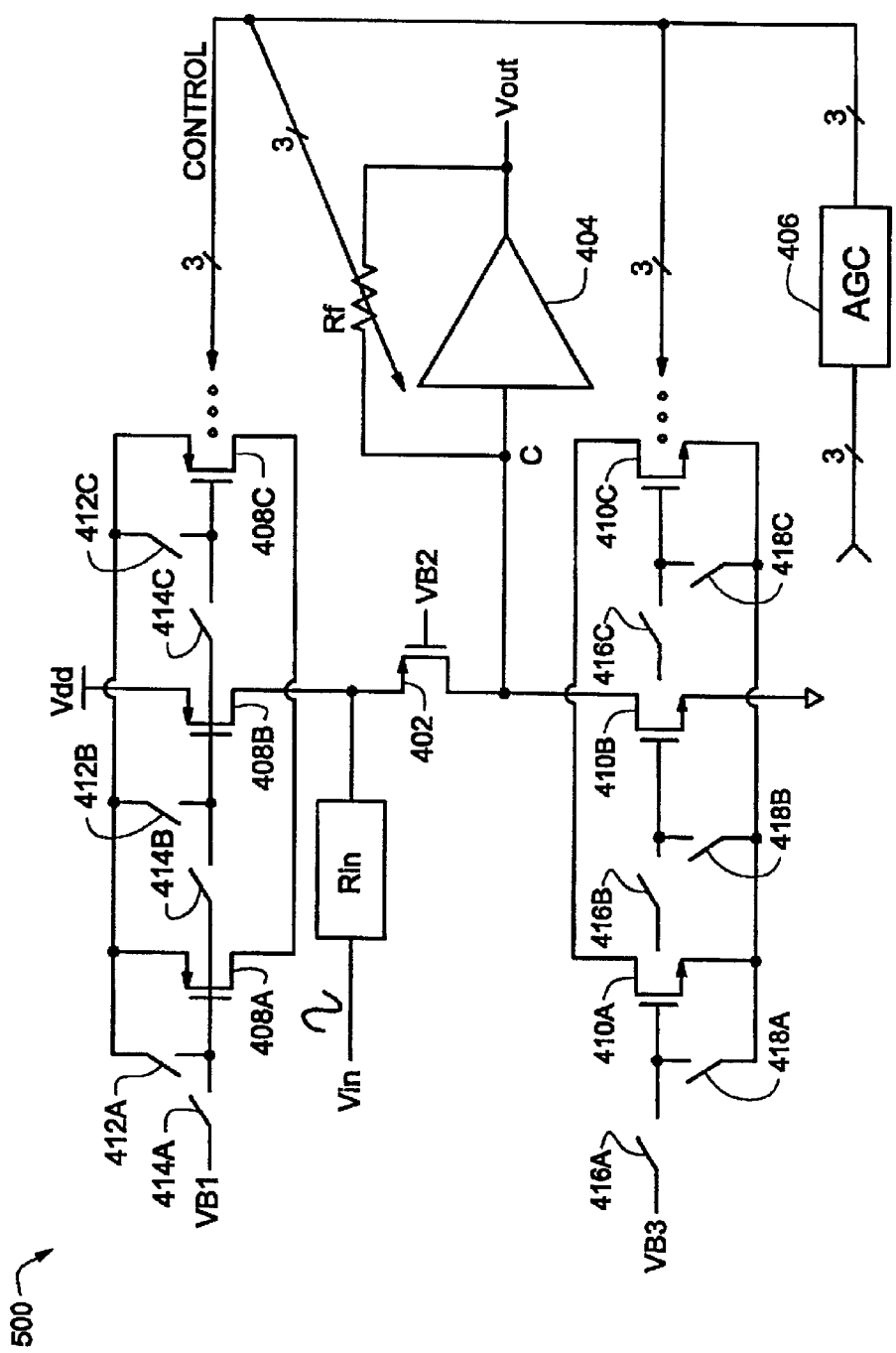
FIG. 5 shows another signal amplification circuit with automatic gain control that is further configured to operate in a manner substantially similar to the circuit illustrated in FIG. 3 and further provide reduced noise and offset when a received signal is weak, in accordance with the present invention.

FIG. 5 illustrates another amplification circuit 500 that can operate in a closed loop configuration at frequencies and gain that are substantially similar to the operation of an amplifier in an open loop configuration while consuming less power and adding less noise to an inputted signal with a varying swing. The circuit shown in FIG. 5 is configured and operates in substantially the same manner as the circuit illustrated in FIG. 3 and discussed above. However, the circuit shown in FIG. 5 is configured to provide relatively less current and less noise from a current conveyor source when the swing of an inputted signal is relatively low and relatively more current when the inputted signal's swing is relatively large.

As shown in FIG. 5, a signal is received at input terminal Vin, which is coupled to an end of input impedance Rin. The other end of input impedance Rin is coupled to a source terminal of PMOS transistor 402 and the drains of PMOS transistors 408A, 408B and 408C. The drain terminal of PMOS transistor 402 is coupled to the drains of NMOS transistors 410A, 410B and 410C, and an end of feedback resistor Rf at Node C. The input to amplifier 404 is also coupled to Node C and the output of the amplifier is coupled to both the other end of feedback resistor RF and the output terminal Vout.

Automatic Gain Control (AGC) component 406 is coupled to feedback resistor Rf and controls the impedance (amplifier gain) provided by the resistor in accordance with the size of the swing of the inputted signal. Also, AGC component 406 controls the operation of three enable switches 414A, 414B, and 414C, and three disable switches 412A, 412B and 412C for PMOS transistors 408A, 408B and 408C, respectively, in response to the size of the high swing in the inputted signal. Similarly, AGC component 406 controls the operation of three enable switches 416A, 416B, and 416C, and three disable switches 418A, 418B and 418C for PMOS transistors 410A, 410B and 410C, respectively, in response to the size of the low swing in the inputted signal.

When an enable switch is closed for an associated MOS transistor, the corresponding disable switch is opened and the transistor begins to conduct and convey a current along with the inputted signal to Node C at the input to amplifier 404. For example, when enable switch 414A is closed and disable switch 412A is opened, PMOS transistor 408A conducts and a current is supplied to the input terminal of amplifier 404 while the inputted signal is swinging high. Similarly, closing enable switch 416A and opening disable switch 418A causes NMOS transistor 410A to conduct and provide a current to the input terminal of amplifier 404 when the inputted signal is swinging low.

Depending on the size of swing of the inputted signal, AGC component 406 will enable or disable more or less MOS transistors in the current conveyor sources. In particular, the AGC component's coordinated operation of PMOS transistors 408A, 408B and 408C form a current conveyor source that provides a variable current in response to the size of a high swing for an inputted signal. Thus, when the signal has a relatively large high swing, all three of these PMOS transistors can be enabled to conduct, i.e., enable switches 414A, 414B, and 414C close and disable switches 412A, 412B, and 412C open. Also, when the inputted signal has a relatively small high swing, only one of the three PMOS transistors would be enabled to conduct, e.g., enable switch 414A would close, enable switch 414B and 414C would open, disable switch 412C would open and disable switches 412B and 412C would close.

Additionally, the closing of the disable switches for either PMOS transistors 408A, 408B, 408C or NMOS transistors 410A, 410B and 410C stops their conduction and causes a reduction in the amount of noise that these transistors add to the operation of circuit 500. When AGC component 406 is not enabling one of the MOS transistors to provide a portion of the current supplied by a current conveyor source, its corresponding disable switch is closed to reduce noise and improve the overall SNR for circuit 500. This feature is particularly helpful in reducing SNR when circuit 500 is employed with an inputted signal that has a relatively small swing. Although not shown, disable and enable switches may be formed with different types of electronic devices, including, but not limited to transistors, analog switches, and the like.

Furthermore, the amount of current supplied by each MOS transistor in the source and sink current conveyor sources for circuit 500 may be substantially the same or varied. For example, PMOS transistor 408A and NMOS transistor 410A could provide 50%, PMOS transistor 408B and NMOS transistors 410B might provide 30%, and PMOS transistor 408C and NMOS transistor 410C could provide the remaining 20% of the total amount of current provided by their respective source and sink current conveyor sources. Moreover, although the embodiment shown in FIG. 5 illustrates source and sink current conveyor sources with three PMOS or NMOS transistors, respectively, it is understood that the operation of the invention with two or substantially more PMOS and NMOS transistors would also provide the significant benefits discussed herein. Also, it is understood that the operation of the PMOS and NMOS transistors in the current conveyor sources does not have to be symmetrical. For example, if it is determined that the size of the high swing for an inputted signal is substantially larger than the size of the low swing, substantially more PMOS transistors could be enabled for providing current than NMOS transistors in the current conveyor sources.

Additionally, overall power consumption by circuit 500 can be further reduced because less current is provided for an inputted signal with a relatively small swing than the amount of current provided for an inputted signal with a relatively large swing. In other words, the bigger the signal, the more MOS transistors that are turned on and the more current that is provided; and where the signal is smaller, fewer MOS transistors are turned on to provide current and power is saved.

It should be appreciated that circuit 500 shown in FIG. 5 enables an amplifier to control the amount of current supplied by current conveyor sources in proportion to the size of the peak-to-peak swing in the received signal without decreasing the SNR for signals with a relatively small swing. This circuit also enables almost open loop performance while operating in a closed loop mode in substantially the same manner as discussed for the circuit shown in FIG. 3. Additionally, since the current provided by the current conveyor sources is reduced for a relatively small inputted signal, PMOS transistor 402 can maintain a relatively stable biasing for efficient operation of circuit 500 even though the swing of the inputted signal can vary substantially.

As mentioned above, circuit 500 conserves power by adjusting the amount of current provided by current conveyor sources in proportion to the size of the swing of the received signal, disables any non-conducting MOS transistors in the current conveyor sources to further reduce noise, provides a relatively stable bias current for varying sizes of peak-to-peak swing in the signal and enables an amplifier to provide substantially open loop performance when arranged in a closed loop configuration. It is further understood that although the embodiments were discussed in terms of the general operation of an automatic gain control component, the invention may be employed with any amplification circuit that enables variable gain of an amplification circuit for an type of inputted signal.

The above specification, examples and data provide a complete description of the manufacture and use of the invention. Since many embodiments of the invention can be made without departing from the spirit and scope of the invention, the invention resides in the claims hereinafter appended.

We claim:

1. An apparatus for amplifying a signal, comprising:
   (a) an amplifier having an output terminal and an input terminal, the amplifier having a resistance that is coupled between the input and output terminals, the input terminal being adapted for receiving the signal;
   (b) a source current source that provides a selectable high swing current, the source current source being coupled to the input terminal of the amplifier;
   (c) a sink current source that provides a selectable low swing current, the sink current source being coupled to the input terminal of the amplifier;
   (d) a controller that determines a size of a swing in the signal, the controller adjusting a gain of the amplifier in response to the determined size of the swing in the signal by varying the resistance coupled between the output terminal and the input terminal of the amplifier, and the controller selecting an amount of current that is supplied by the source current source to the input terminal of the amplifier if the signal swings high and selecting an amount of current that is supplied by the sink current source to the input terminal of the amplifier if the signal swings low, wherein the selected amount of current provided by the sink current source and the selected amount of current provided by the source current source enable the amplifier to operate with open loop performance when arranged in a closed loop configuration.

2. The apparatus of claim 1, further comprising a switch for disabling at least a portion of the source current source if the high swing of the signal is small, wherein an operation of the switch causes noise produced by at least a portion of the source current source to be reduced.

3. The apparatus of claim 1, further comprising a switch for disabling at least a portion of the sink current source if the low swing of the signal is small, wherein an operation of the switch causes noise produced by at least a portion of the sink current source to be reduced.

4. The apparatus of claim 1, further comprising at least one of a plurality of PMOS transistors that is employed by the source current source to provide the selected amount of current.

5. The apparatus of claim 1, further comprising at least one of a plurality of NMOS transistors that is employed by the sink current source to provide the selected amount of current.

6. The apparatus of claim 1, further comprising a bias switch coupled between the source current source and the input terminal of the amplifier, wherein a bias current enabled by the operation of the bias switch enables the operation of the amplifier.

7. The apparatus of claim 6, wherein the bias switch includes at least one of a PMOS and an NMOS transistor.

8. The apparatus of claim 1, wherein the controller is an automatic gain control component.

9. The apparatus of claim 1, wherein the controller determines the size of a peak-to-peak swing in the signal.

10. The apparatus of claim 1, wherein the signal is generated by a communication device.

11. An apparatus for amplifying an input signal, comprising:
    (a) an amplifier having an output terminal and an input terminal, the amplifier having a variable resistance that is coupled between the input and output terminals and enabling the input signal to be received at the input terminal;
    (b) a current source that is coupled to the input terminal of the amplifier; the current source providing a selectable high swing current from the conduction of at least one of a plurality of PMOS transistors and a selectable low swing current from the conduction of at least one of a plurality of NMOS transistors;
    (c) a controller that determines a size of a peak-to-peak swing in the input signal, the controller adjusting the variable resistance of the amplifier in response to the determined size of the peak-to-peak swing in the input signal to control the gain of the amplifier, and the controller selecting an amount of high swing current to be provided by the current source to the input terminal of the amplifier when the input signal swings high and selecting an amount of low swing current that is supplied by the current source to the input terminal of the amplifier when the input signal swings low, wherein the selected amounts of low and high swing currents provided by the current source enable the amplifier to operate with open loop performance when arranged in a closed loop configuration.

12. The apparatus of claim 11, further comprising a switch for disabling at least a portion of the current source if at least a portion of the peak-to-peak swing of the input signal is small, wherein an operation of the switch causes noise produced by at least a portion of the current source to be reduced.

13. The apparatus of claim 11, further comprising at least one of a plurality of PMOS transistors and at least one of a plurality of NMOS transistors that are employed by the current source to provide the selected amount of current.

14. The apparatus of claim 11, further comprising a bias switch coupled to the input terminal of the amplifier, wherein a bias current enabled by the operation of the bias switch enables the operation of the amplifier.

15. The apparatus of claim 11, wherein the controller includes an automatic gain control component for determining the size of the peak-to-peak swing in the signal.

16. An apparatus for amplifying an input signal, comprising:
 (a) means for amplifying the input signal received at an input terminal with a variable gain;
 (b) means for providing a selectable high swing current and a selectable low swing current;
 (c) means for determining a size of a peak-to-peak swing in the input signal, and adjusting the variable gain in response to the determined size of the peak-to peak swing in the input signal, wherein a selected amount of high swing current is provided when the input signal swings high and a selected amount of low swing current is supplied by the current source when the input signal swings low, wherein the selected amounts of low and high swing currents provided enable open loop performance when an amplifying means is arranged in a closed loop configuration.

* * * * *

UNITED STATES PATENT AND TRADEMARK OFFICE
CERTIFICATE OF CORRECTION

PATENT NO. : 6,724,251 B1
DATED : April 20, 2004
INVENTOR(S) : Ramsin M. Ziazadeh et al.

It is certified that error appears in the above-identified patent and that said Letters Patent is hereby corrected as shown below:

Column 4,
Line 19, after "Rf" insert -- . --.
Line 58, delete "cascading" and insert -- cascoding --.

Column 10,
Line 1, delete "peak-to peak" and insert -- peak-to-peak --.

Signed and Sealed this

Fifteenth Day of February, 2005

JON W. DUDAS
*Director of the United States Patent and Trademark Office*